US012163900B2

(12) United States Patent
Ikesu et al.

(10) Patent No.: US 12,163,900 B2
(45) Date of Patent: Dec. 10, 2024

(54) SEMICONDUCTOR FAILURE ANALYSIS DEVICE

(71) Applicant: HAMAMATSU PHOTONICS K.K., Hamamatsu (JP)

(72) Inventors: Masataka Ikesu, Hamamatsu (JP); Ikuo Arata, Hamamatsu (JP); Yoshihiro Ito, Hamamatsu (JP); Toshimichi Ishizuka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 205 days.

(21) Appl. No.: 17/795,570

(22) PCT Filed: Nov. 24, 2020

(86) PCT No.: PCT/JP2020/043608
§ 371 (c)(1),
(2) Date: Jul. 27, 2022

(87) PCT Pub. No.: WO2021/152977
PCT Pub. Date: Aug. 5, 2021

(65) Prior Publication Data
US 2023/0087835 A1  Mar. 23, 2023

(30) Foreign Application Priority Data
Jan. 31, 2020 (JP) ................. 2020-014907

(51) Int. Cl.
*G01N 21/95* (2006.01)
*G01N 21/71* (2006.01)
*G01N 21/88* (2006.01)
(52) U.S. Cl.
CPC ......... *G01N 21/9505* (2013.01); *G01N 21/71* (2013.01); *G01N 21/8806* (2013.01)

(58) Field of Classification Search
CPC . G01N 21/9505; G01N 21/71; G01N 21/8806
See application file for complete search history.

(56) References Cited

U.S. PATENT DOCUMENTS 10,330,615 B2 * 6/2019 Nakamura ............. G01R 31/30
2007/0183057 A1   8/2007 Terada et al.
(Continued)

FOREIGN PATENT DOCUMENTS

| JP | H11-120610 A | 4/1999 |
|----|--------------|--------|
| JP | 2008-016778 A | 1/2008 |

(Continued)

OTHER PUBLICATIONS

International Preliminary Report on Patentability mailed Aug. 11, 2022 for PCT/JP2020/043608.

*Primary Examiner* — Hung V Nguyen
(74) *Attorney, Agent, or Firm* — Faegre Drinker Biddle & Reath LLP

(57) ABSTRACT

The semiconductor failure analysis device includes: a light source configured to generate irradiation light with which the semiconductor device is irradiated; a solid immersion lens disposed on an optical path of the irradiation light; a light detection unit configured to receive reflected light and to output a detection signal according to the reflected light; an optical system 6 disposed between the light source and the solid immersion lens to emit the irradiation light to the semiconductor device via the solid immersion lens and disposed between the solid immersion lens and the light detection unit to emit the reflected light received via the solid immersion lens to the light detection unit. The light source emits the irradiation light having a center wavelength of 880 nm or more and 980 nm or less. The solid immersion lens is formed of GaAs.

4 Claims, 6 Drawing Sheets

(56) References Cited

U.S. PATENT DOCUMENTS

| | | |
|---|---|---|
| 2010/0253379 A1 | 10/2010 | Ippolito et al. |
| 2011/0216312 A1* | 9/2011 | Matsumoto .......... G01R 31/308 356/237.1 |
| 2015/0002182 A1 | 1/2015 | Eiles et al. |
| 2015/0276864 A1 | 10/2015 | Yurt et al. |
| 2017/0123003 A1 | 5/2017 | Nakamura |
| 2017/0261545 A1 | 9/2017 | Federley et al. |
| 2017/0299534 A1 | 10/2017 | Nakamura et al. |
| 2019/0271734 A1* | 9/2019 | Matsumoto .......... G01R 31/303 |

FOREIGN PATENT DOCUMENTS

| | | |
|---|---|---|
| JP | 2013-104667 A | 5/2013 |
| JP | 2014-092514 A | 5/2014 |
| JP | 2016-534344 A | 11/2016 |
| JP | 2017-167006 A | 9/2017 |
| TW | 201823789 A | 7/2018 |
| WO | WO-2010/024324 A1 | 3/2010 |
| WO | WO-2015/024679 A1 | 2/2015 |
| WO | WO-2016/056110 A1 | 4/2016 |

\* cited by examiner

SEMICONDUCTOR FAILURE ANALYSIS DEVICE

TECHNICAL FIELD

The present invention relates to a semiconductor failure analysis device.

BACKGROUND ART

Miniaturization of semiconductor devices is progressing. In order to miniaturize semiconductor devices, it is desired to improve an exposure technique and a patterning technique for manufacturing a semiconductor device. A technique for inspecting for whether or not a semiconductor device manufactured by these technologies operates normally is also important. Furthermore, in a case where a semiconductor device does not operate normally, a technique for clarifying a cause of a defect is also important.

Patent Literature 1 and 2 disclose a device for inspecting a semiconductor device. The inspection device disclosed in Patent Literature 1 and 2 irradiates a semiconductor device to which an electrical signal is applied with light. The light applied to the semiconductor device becomes reflected light according to a state of the semiconductor device. Then, the inspection device disclosed in Patent Literature 1 and 2 obtains information on an operating state of the semiconductor device using the reflected light. The inspection device of Patent Literature 1 obtains information on a portion of the semiconductor device operating at a predetermined frequency. The inspection device of Patent Literature 2 obtains information on a heat source generated at a failure portion of the semiconductor device.

CITATION LIST

Patent Literature

[Patent Literature 1] Japanese Unexamined Patent Publication No. 2014-92514
[Patent Literature 2] PCT International Publication No. WO 2016/056110

SUMMARY OF INVENTION

Technical Problem

In the technical field of semiconductor failure analysis devices, further improvement in resolution is desired in order to analyze minute regions.

The present invention provides a semiconductor failure analysis device capable of improving a resolution.

Solution to Problem

An embodiment of the present invention is a semiconductor failure analysis device that analyzes for a failure portion included in a semiconductor device using a response to a stimulation signal. The semiconductor failure analysis device includes: a signal generation unit configured to apply a stimulation signal to the semiconductor device; a light source configured to generate irradiation light with which the semiconductor device is irradiated; a solid immersion lens disposed on an optical path of the irradiation light; a light detection unit configured to receive reflected light generated by the irradiation light being reflected by the semiconductor device and to output a detection signal according to the reflected light; an optical system disposed between the light source and the solid immersion lens to emit the irradiation light to the semiconductor device via the solid immersion lens and disposed between the solid immersion lens and the light detection unit to emit the reflected light received via the solid immersion lens to the light detection unit; and an analysis unit configured to obtain information on a failure portion of the semiconductor device from the detection signal. The light source emits the irradiation light having a center wavelength of 880 nm or more and 980 nm or less. The solid immersion lens is formed of gallium arsenide (GaAs).

In a case where a failure portion of the semiconductor device to which the stimulation signal is applied is identified, the semiconductor failure analysis device irradiates the semiconductor device with the irradiation light having a center wavelength of 880 nm or more and 980 nm or less via the solid immersion lens formed of gallium arsenide. The irradiation light having a center wavelength of 880 nm or more and 980 nm or less is sufficiently transmitted through the semiconductor device which is the analysis target. As a result, it is possible to obtain reflected light having a light intensity able to be used for identifying a failure portion. Further, the refractive index of the solid immersion lens formed of gallium arsenide is higher than the refractive index of air. Therefore, it is possible to increase a numerical aperture (NA). As a result, it becomes possible to reduce a spot diameter of the irradiation light, and thus, it is possible to improve a resolution.

In the embodiment, the light source may emit the irradiation light having a center wavelength of 900 nm or more and 960 nm or less. According to this configuration, it is possible to suitably improve the resolution.

In the embodiment, the analysis unit may have a heat source position identification unit. The heat source position identification unit may identify a position of a heat source generated in the semiconductor device as a response to the stimulation signal on the basis of the detection signal and the stimulation signal. According to this configuration, it is possible to identify a position of the heat source generated inside the semiconductor device.

In the embodiment, the analysis unit may have an operating frequency identification unit. The operating frequency identification unit may identify a position on the semiconductor device operating at a predetermined frequency generated in the semiconductor device as a response to the stimulation signal on the basis of the detection signal and the stimulation signal. According to this configuration, it is possible to identify a position on the semiconductor device operating at a predetermined frequency generated in the semiconductor device.

Advantageous Effects of Invention

According to the present invention, a semiconductor failure analysis device capable of improving a resolution is provided.

DESCRIPTION OF EMBODIMENTS

Hereinafter, an embodiment for carrying out the present invention will be described in detail with reference to the accompanying drawings. In the description of the drawings, the same elements will be designated by the same reference signs, and duplicate description will be omitted.

Figure 1:
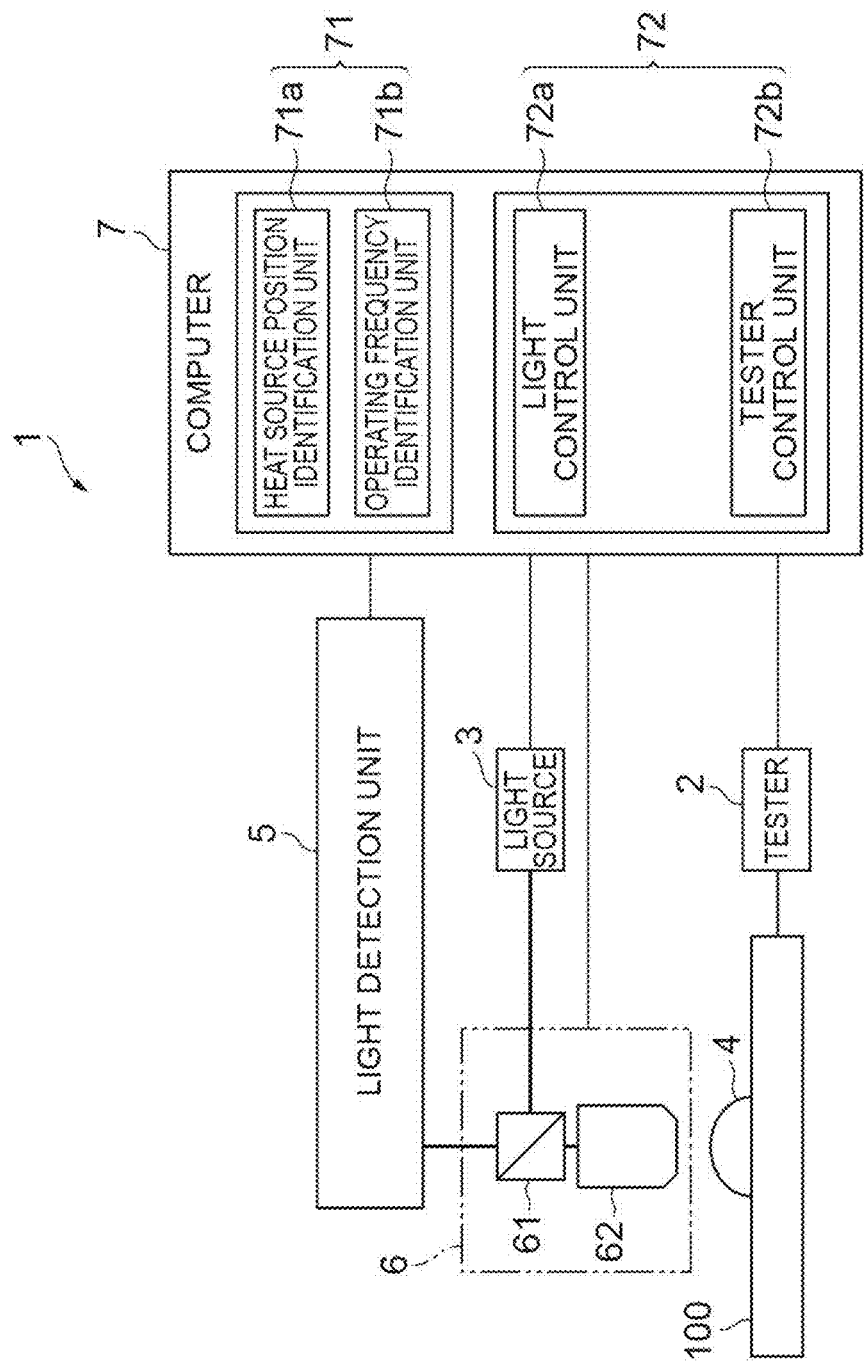
FIG. 1 is a block diagram showing constituent elements of a semiconductor failure analysis device.

As shown in FIG. 1, a semiconductor failure analysis device identifies a failure portion included in an object to be inspected such as a semiconductor device 100. In the following description, the semiconductor failure analysis device is simply referred to as an analysis device 1.

Examples of the semiconductor device 100 include an integrated circuit having a PN junction such as a transistor (for example, a small scale integration (SSI), a medium scale integration (MSI), a large scale integration (LSI), a very large scale integration (VLSI), an ultra large scale integration (VLSI), a giga scale integration (GSI)), an MOS transistor for a large current and a high voltage, a power device such as a bipolar transistor, a memory and storage device, and the like.

The object to be inspected is not limited to a fragmented semiconductor device 100. The object to be inspected may be a semiconductor wafer on which a plurality of semiconductor devices 100 are formed.

Figure 2:
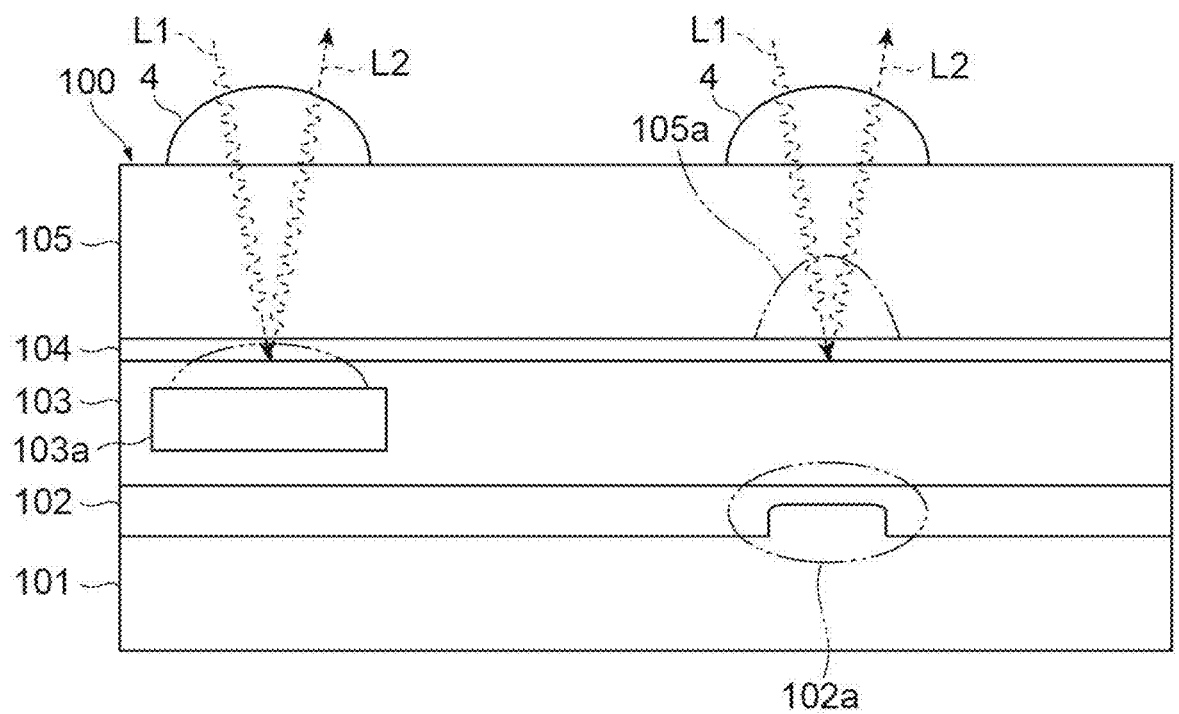
FIG. 2 is a view for explaining an example of a means for identifying a failure portion of a semiconductor device.

FIG. 2 is a diagram conceptually showing a method for identifying a failure portion. The semiconductor device 100 shown in FIG. 2 is adapted to a state of being disposed in the analysis device 1. In FIG. 2, a surface that receives irradiation light L1 is shown as an upper side. As an example, the semiconductor device 100 has a stacked structure including a protective layer 101, a wiring layer 102, a process layer 103, an insulating layer 104, and a substrate 105. The wiring layer 102 includes a wiring pattern made of a metal such as gold or aluminum. The process layer 103 includes a plurality of electrical functional parts such as a MOS transistor 103a. The substrate 105 is formed of silicon. A thickness of the substrate 105 is about 50 nm or more and 200 nm. The thickness of the substrate 105 is, for example, 80 nm. When the semiconductor device 100 is irradiated with light, a certain layer transmits the light. Further, another layer reflects the light. For example, when light is applied from a side of the substrate 105, the light may be transmitted through the substrate 105 and the insulating layer 104. Further, when light is applied from a side of the substrate 105, the light may be reflected by the process layer 103.

An intensity of the reflected light is basically smaller than an intensity of the irradiation light L1. That is, the intensity of the reflected light is attenuated due to factors influencing the light while being transmitted through the substrate 105 and the insulating layer 104. For example, light is affected by a light transmittance of a material forming the substrate 105. In addition, the intensity of the light may be affected by a refractive index of a material forming an optical path. Further, the intensity of the light may be affected by an electric field formed in the layers constituting the optical path. Therefore, a ratio of the intensity of the reflected light to an intensity of incident light is defined as an apparent reflectance. A change in reflectance reflects a change in refractive index and an effect of an electric field. Therefore, it is possible to ascertain an internal state of the semiconductor device 100 by obtaining a distribution of the reflectance. For example, it may be assumed that a portion 102a having a high electrical resistance value will be generated in the wiring layer 102 and Joule heat will be generated in the portion 102a. As a result, a portion 105a in which a refractive index of the insulating layer 104 and the substrate 105 whose temperature has risen due to the Joule heat has changed is generated. The change in refractive index appears as a change in reflectance. That is, it is possible to identify a position of a portion where abnormal heat generation occurs by ascertaining the distribution of the reflectance. The position of the portion where abnormal heat generation occurs is a position of the failure portion.

FIG. 1 will be referred to again. The analysis device 1 includes a tester 2 (a signal generation unit), a light source 3, a solid immersion lens 4, a light detection unit 5, an optical system 6, and a computer 7.

The analysis device 1 may have any other additional constituent elements. For example, the analysis device 1 may have a stage for moving the semiconductor device 100 relative to the optical system 6.

The tester 2 outputs a stimulation signal. The tester 2 is connected to the semiconductor device 100. The tester 2 applies a stimulation signal to the semiconductor device 100. The tester 2 generates a stimulation signal on the basis of a control signal input from the computer 7. The tester 2 starts and stops the output of the stimulation signal on the basis of on the control signal. A property of the stimulation signal may be determined according to an aspect of analysis. Further, a power supply, a pulse generator, or the like may be used as the tester 2.

For example, one aspect of the analysis is to identify a heat source position. In a case where the heat source position is identified, the tester 2 applies a modulated current having a relatively low frequency as a stimulation signal. For example, in a case where a short-circuited portion is included inside the semiconductor device 100, the short-circuited portion generates heat due to the modulated current. As a result, a heat source is generated in the semiconductor device 100. A temperature of a heat source that generates heat due to the modulated current changes periodically according to the frequency of the modulated current. The change in temperature causes a change in the refractive index of a member that is present around the heat source and through which the irradiation light and the reflected light pass. The change in the refractive index causes a change in the intensity of the reflected light. As a result, the reflectance which is a degree of the intensity of the reflected light with respect to the intensity of the irradiation light changes. By using the change in reflectance due to the temperature change of the heat source as a response to the stimulation signal, it is possible to identify a short-circuited portion which is an example of a failure portion included in the semiconductor device 100.

For example, another aspect of the analysis is to identify a position of a circuit operating at a target frequency. As such an analysis technique, an optical probing technique is known. The optical probing technique is also referred to as electro optical probing (EOP) or electro-optical frequency mapping (EOFM). In the optical probing technique, the integrated circuit is irradiated with the light emitted from the light source. Next, the reflected light reflected by the integrated circuit is detected by an optical sensor. Next, a detection signal is acquired from the optical sensor. Then, a signal component having a target frequency is selected from the acquired detection signal. An amplitude energy of this signal component is displayed with the passage of time. Further, the amplitude energy is displayed as a two-dimensional mapping. That is, in the optical probing technique, failure analysis of the semiconductor device 100 is performed on the basis of the intensity modulation of the light emitted from the semiconductor device 100 being driven. Therefore, the tester 2 applies an electrical signal having a predetermined modulation frequency to the semiconductor device 100. The modulation frequency in this case may be higher than the frequency of the stimulation signal used in the analysis for identifying a heat source position. For example, the tester 2 may apply a drive current having a frequency equivalent to that of a drive signal of the semiconductor device 100 as a stimulation signal.

As mentioned above, there are several types of aspects of the analysis. However, the differences therebetween are primarily due to the aspect of the stimulation signal applied to the semiconductor device 100 and secondarily due to processing details of the detection signal obtained in response to the stimulation signal. That is, even if the aspects of the analysis are different, there is almost no difference in the configuration of the analysis device 1.

The light source 3 generates the irradiation light L1. A center wavelength of the irradiation light L1 may be 880 nm or more and 980 nm or less. In a case where the center wavelength is 880 nm or more and 980 nm or less, the irradiation light L1 may have a band of about 20 nm. A center wavelength of the irradiation light L1 may be 900 nm or more and 960 nm or less. In a case where the center wavelength is 900 nm or more and 960 nm or less, the irradiation light L1 may have a band of about 20 nm.

In the light source 3, a configuration capable of emitting the irradiation light L1 having the above wavelength properties may be appropriately employed. For example, the light source 3 may be constituted by a super luminescent diode (SLD) or a light emitting diode (LED). Further, the light source 3 may be constituted by an incoherent light source or the like in which a lamp light source and an optical filter such as a bandpass filter are combined with each other. The light source 3 may be a laser light source such as a laser diode (LD). The irradiation light L1 may be CW light. The irradiation light L1 may be pulsed light.

The irradiation light L1 output from the light source 3 is first incident on the optical system 6. The optical system 6 guides the irradiation light L1 to the solid immersion lens 4. For example, the optical system 6 includes a polarization beam splitter 61 and an objective lens 62. Further, in the optical system 6, in addition to these, an optical system product for the irradiation light L1 may be appropriately employed. For example, the optical system 6 may include an optical scanner. The optical scanner changes an irradiation position of the irradiation light L1 in the semiconductor device 100. The optical scanner is, for example, a galvano mirror scanner, a polygon mirror scanner, an MEMS mirror scanner, or the like. The optical scanner guides the irradiation light L1 to a desired position on the semiconductor device 100. The irradiation light L1 output from the optical system 6 is applied to the semiconductor device 100 via the solid immersion lens 4. More specifically, the irradiation light L1 is applied to a measurement point set for the semiconductor device 100.

The solid immersion lens 4 has a hemispherical shape or a super hemispherical shape. The solid immersion lens 4 optically adheres to the semiconductor device 100. The solid immersion lens 4 irradiates a position to be analyzed in the semiconductor device 100 with the irradiation light L1 while condensing the irradiation light L1. Therefore, a material forming the solid immersion lens 4 has a property of transmitting the irradiation light L1 with which the semiconductor device 100 is irradiated. Similarly, the material forming the solid immersion lens 4 has a property of transmitting the reflected light L2 emitted from the semiconductor device 100.

Figure 3:
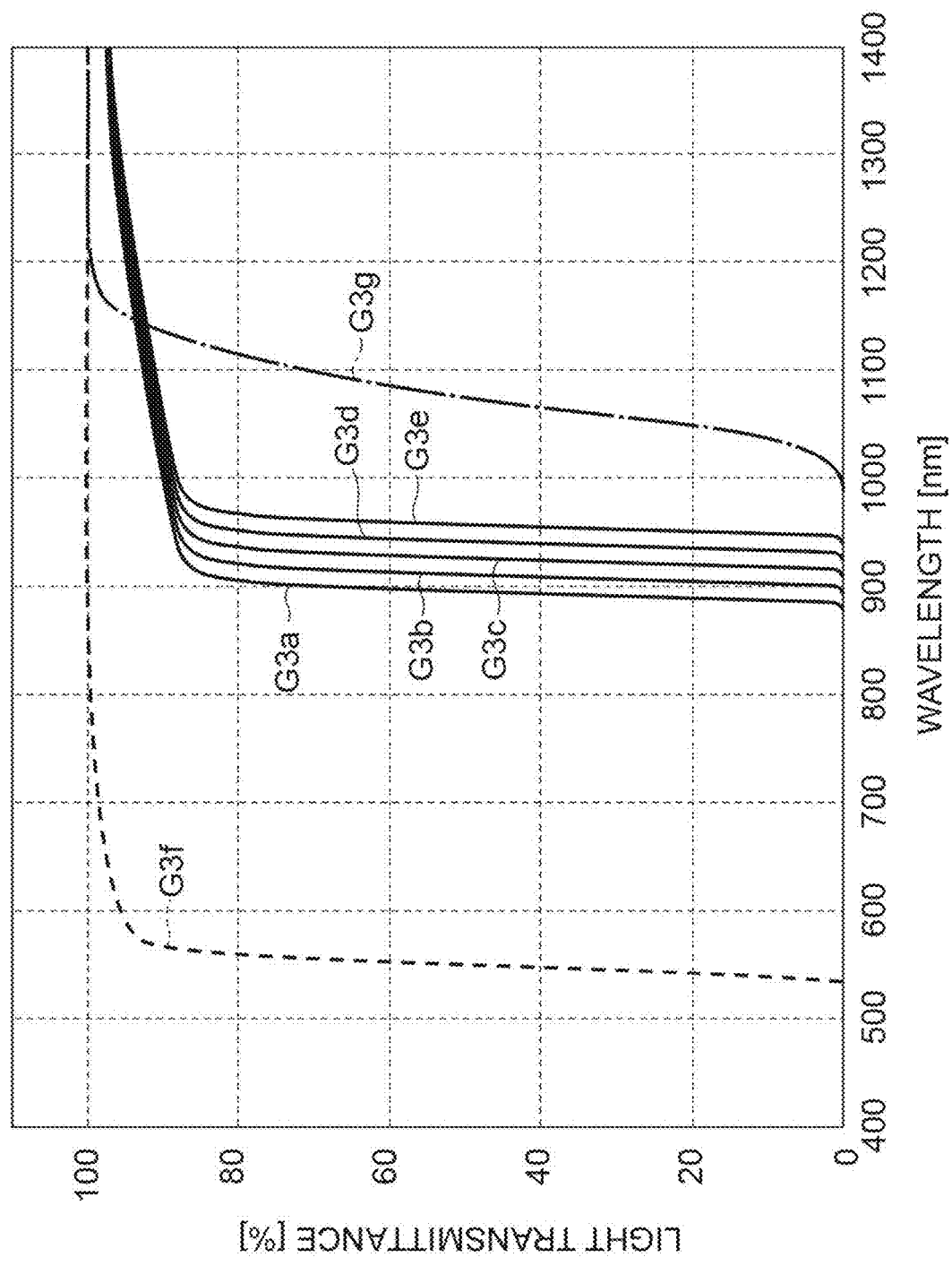
FIG. 3 is a graph showing a relationship between a wavelength of light and a light transmittance for each material forming a solid immersion lens.

In the solid immersion lens 4, as a material having a property of transmitting light, gallium arsenide (GaAs) is employed. Hereinafter, a light transmitting property as an optical property of GaAs will be described. FIG. 3 shows a light transmittance of GaAs. In addition, FIG. 3 also shows a light transmittance of gallium phosphide (GaP) and silicon (Si) as a comparative example. A horizontal axis indicates the wavelength of the light. A vertical axis indicates the light transmittance. Graphs G3a to G3e indicate the light transmittance of GaAs. A graph G3f indicates the light transmittance of GaP. A graph G3g indicates the light transmittance of Si.

With reference to the graphs G3a to G3e, it can be seen that GaAs has a property of transmitting light having a wavelength longer than 850 nm. More specifically, GaAs has a band in which the light transmittance changes abruptly in a relationship between the light transmittance and the wavelength of light. The wavelength included in such a band is also simply called a cutoff wavelength. A cutoff wavelength of GaAs is present in a range of, for example, 880 nm or more and 980 nm or less. When the wavelength of light changes from a short wavelength to a long wavelength, the light transmittance rapidly increases from 0% to 80% or more. Furthermore, the relationship between the light transmittance and the wavelength of light also changes according to a temperature of GaAs. Each of the graphs G3a to G3e shows the light transmittance when the temperature is 0° C. (the graph G3a), 50° C. (the graph G3b), 100° C. (the graph G3c), 150° C. (the graph G3d), or 200° C. (the graph G3e). That is, as the temperature of GaAs increases, the cutoff wavelength in which the light transmittance changes abruptly shifts to longer wavelength.

For example, GaP may be employed as the material of the solid immersion lens. With reference to the graph G3f, it can be seen that GaP transmits light having a wavelength longer than 500 nm. For example, a cutoff wavelength of GaP is included in a range of about 500 nm or more and 600 nm. That is, the cutoff wavelength of GaP is shorter than the cutoff wavelength of GaAs. In other words, the cutoff wavelength of GaAs is longer than the cutoff wavelength of GaP.

For example, Si may be employed as the material of the solid immersion lens. With reference to the graph G3g, it can be seen that Si transmits light having a wavelength longer than 1000 nm. For example, a cutoff wavelength of Si having a thickness with which it is able to be effectively used for the solid immersion lens is within a range of about 1000 nm or more and 1200 nm. That is, the cutoff wavelength of a Si solid immersion lens is longer than the cutoff wavelength of GaAs. In other words, the cutoff wavelength of GaAs is shorter than the cutoff wavelength of Si.

Figure 4:
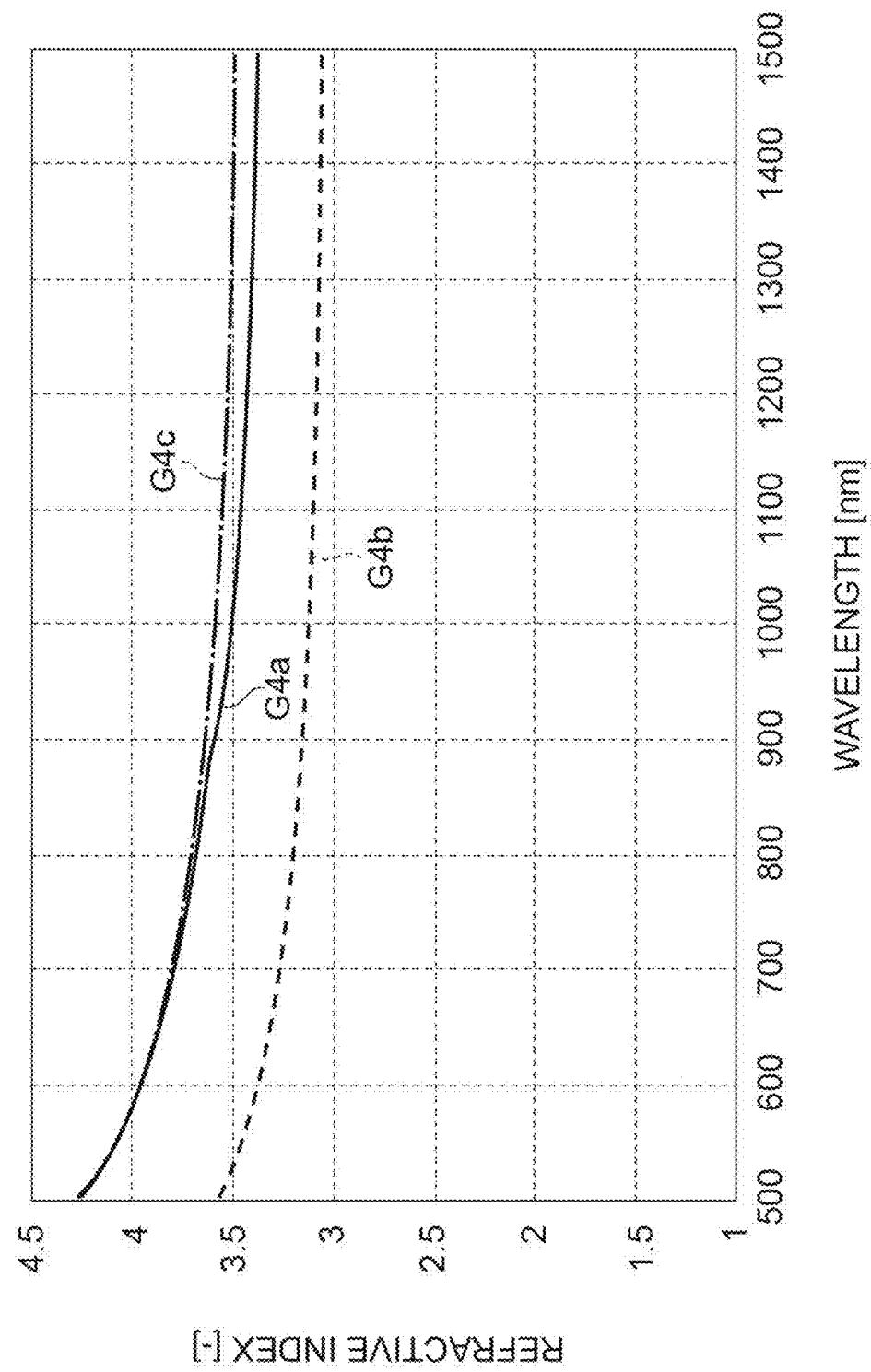
FIG. 4 is a graph showing a relationship between a wavelength of light and a refractive index for each material forming a solid immersion lens.

A refractive index which is another optical property of GaAs will be described. FIG. 4 shows a relationship between the refractive index and wavelength of GaAs, GaP, and Si. A graph G4a indicates the refractive index of GaAs. A graph G4b indicates the refractive index of GaP. A graph G4c indicates the refractive index of Si. For example, according to the graph G4a, the refractive index of GaAs is about 3.40 or more and 4.40 or less. For example, when the wavelength of the incident light is 1064 nm, the refractive index of GaAs is 3.47. Further, when the wavelength of the incident light is 940 nm, the refractive index of GaAs is 3.57.

The refractive index of GaAs is higher than, for example, the refractive index of GaP indicated as the graph G4b. More specifically, in the entire range of 500 nm to 1500 nm shown on the horizontal axis of FIG. 4, the refractive index of GaAs is higher than that of GaP. For example, when the wavelength of the incident light is 780 nm, the refractive index of Gap is 3.21. Further, when the wavelength of the incident light is 670 nm, the refractive index of Gap is 3.27. Therefore, GaAs is more advantageous than GaP in improving the resolution in that it has a high refractive index.

FIG. 1 will be referred to again. The light (the reflected light L2) reflected at the measurement point according to the irradiation light L1 is input to the polarization beam splitter 61 via the solid immersion lens 4 and the objective lens 62. At this time, by disposing a short pass filter in the optical path of the reflected light L2, it is possible to shield an infrared ray generated by the semiconductor device 100. Further, the light input to the polarization beam splitter 61 is transmitted through a 214 plate twice. As a result, a polarization direction is tilted. The reflected light whose polarization direction is tilted is transmitted through the polarization beam splitter 61. The reflected light L2 transmitted through the polarization beam splitter 61 is input to the light detection unit 5.

As described above, the optical system of the present embodiment is a confocal optical system. The optical system of the present embodiment can detect the reflected light L2 in a limited focal range. As an element constituting the confocal optical system, a pinhole may be employed. Further, as the element constituting the confocal optical system, a configuration utilizing a difference in refractive index between a core and a clad of an optical fiber may be employed.

The light detection unit 5 detects the light intensity and the like of the reflected light L2 reflected by the semiconductor device 100 according to the irradiation light L1. The light detection unit 5 converts the detected reflected light L2 into a detection signal which is an analog signal. Then, the light detection unit 5 outputs the detection signal. The light detection unit 5 is an avalanche photodiode (APD), a photodiode (PD), a photomultiplier tube (PMT), silicon photomultipliers (SiPM), or the like.

The computer 7 has a data analysis unit 71 and a control unit 72. The data analysis unit 71 identifies a failure portion of the semiconductor device 100. The control unit 72 controls an operation of various elements constituting the analysis device 1. The computer 7 physically includes a memory such as RAM and ROM, a processor (an arithmetic circuit) such as a CPU, a communication interface, and a storage unit such as a hard disk. Examples of the computer 7 include a personal computer, a cloud server, a smart device (a smartphone, a tablet terminal, or the like), and the like. The computer 7 functions by executing a program stored in the memory with the CPU of a computer system. Further, the data analysis unit 71 may include a processing unit according to the aspect of analysis. For example, the data analysis unit 71 includes a heat source position identification unit 71a and/or an operating frequency identification unit 71b. The heat source position identification unit 71a performs a process for identifying the position of the heat source. The operating frequency identification unit 71b performs a process for identifying a position on the semiconductor device operating at a predetermined frequency generated in the semiconductor device as a response to the stimulation signal on the basis of the detection signal and the stimulation signal.

The control unit 72 includes, for example, a light control unit 72a and a tester control unit 72b. The light control unit 72a outputs a control signal to the light source 3 and the optical system 6. Examples of such a control signal include a signal for driving an optical scanner to scan with the irradiation light L1. The tester control unit 72b outputs a control signal for controlling the stimulation signal to be output from the tester 2 to the semiconductor device 100.

<Operation and Effect>

In a case where a failure portion of the semiconductor device 100 to which the stimulation signal is applied is identified, the analysis device 1 irradiates the semiconductor device 100 with the irradiation light L1 having a center wavelength of 880 nm or more and 980 nm or less via the solid immersion lens 4 formed of GaAs. The irradiation light L1 having a center wavelength of 880 nm or more and 980 nm or less is sufficiently transmitted through the semiconductor device 100 which is the analysis target and is made of silicon. As a result, it is possible to obtain the reflected light L2 having a light intensity able to be used for identifying the failure portion. Further, the refractive index of the solid immersion lens 4 formed of GaAs is higher than the refractive indexes of air and GaP. Therefore, it is possible to increase a numerical aperture (NA). As a result, it becomes possible to reduce a spot diameter of the irradiation light L1. Therefore, the resolution can be improved.

When a stimulation signal is applied to the semiconductor device 100, heat is generated in a pattern wiring or an electrical functional part regardless of the aspect of the stimulation signal. Then, the degree of heat generation tends to increase at the failure portion. In the analysis utilizing such heat generation, a combination of the irradiation light L1 having a center wavelength of 880 nm or more and 980 nm or less and the solid immersion lens 4 formed of GaAs is particularly advantageous.

Figure 5:
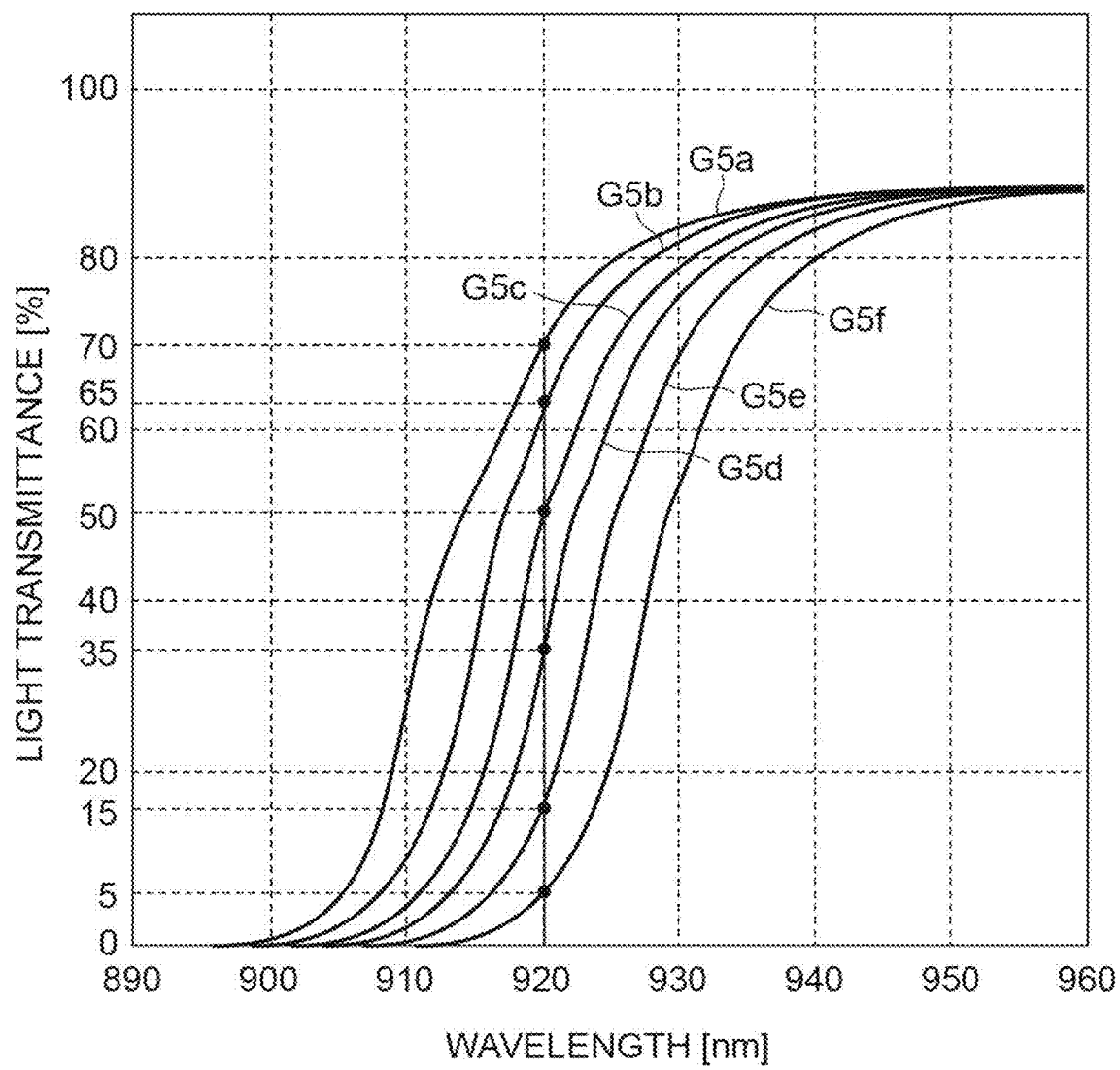
FIG. 5 is a graph showing a relationship between a wavelength of light and a light transmittance of a solid immersion lens formed of gallium arsenide.

FIG. 5 shows a relationship between the wavelength and the light transmittance of GaAs as in FIG. 3. FIG. 5 shows a range from 890 nm to 960 nm under enlargement. Each of graphs G5a to G5f shows the light transmittance when the temperature of GaAs is 60° C. (the graph G5a), 70° C. (the graph G5b), 80° C. (the graph G5c), 90° C. (the graph G5d), 100° C. (the graph G5e), or 110° C. (the graph G5f). For example, it is assumed that the wavelength of the irradiation light L1 is 920 nm. Further, it is assumed that the temperature of the solid immersion lens 4 changes between 60° C. and 110° C. In this case, the light transmittance of the solid immersion lens 4 changes in a range of 5% to 70%. That is, the light transmittance of the solid immersion lens 4 changes greatly according to the temperature of the solid immersion lens 4.

The irradiation light L1 and the reflected light L2 pass through not only the substrate 105 of the semiconductor device 100 but also the solid immersion lens 4. Then, the irradiation light L1 and the reflected light L2 are affected by the change in the light transmittance due to the temperature change of the solid immersion lens 4 when passing through the solid immersion lens 4. That is, the irradiation light L1 and the reflected light L2 are affected by the refractive index of the semiconductor device 100 whose temperature has changed due to the heat generated from the heat source. Further, the irradiation light L1 and the reflected light L2 are also affected by the change in the light transmittance of the solid immersion lens 4. As a result, the light intensity of the reflected light L2 changes greatly due to heat generation, and thus the change in reflectance also becomes large. Then, even if a temperature difference between measurement positions is small, it appears as a large change in reflectance. Therefore, it is possible to improve the resolution with respect to the temperature.

In short, since the center wavelength of the irradiation light L1 is included in the band of the cutoff frequency of GaAs, the resolution with respect to temperature is improved. That is, the center frequency of the irradiation light L1 may be set to a value at which a large change in light transmittance can be obtained in a temperature range including a normal temperature and an abnormal temperature. For example, in a case where the normal temperature is 60° C. and a temperature of 100° C. or higher is determined to be abnormal, the center wavelength may be set to 920 nm. This is because, according to such a setting, in a case where there is a heat source in which the solid immersion lens 4 is heated to 100° C. or higher, a phenomenon that the reflectance is significantly lowered appears.

Figure 6:
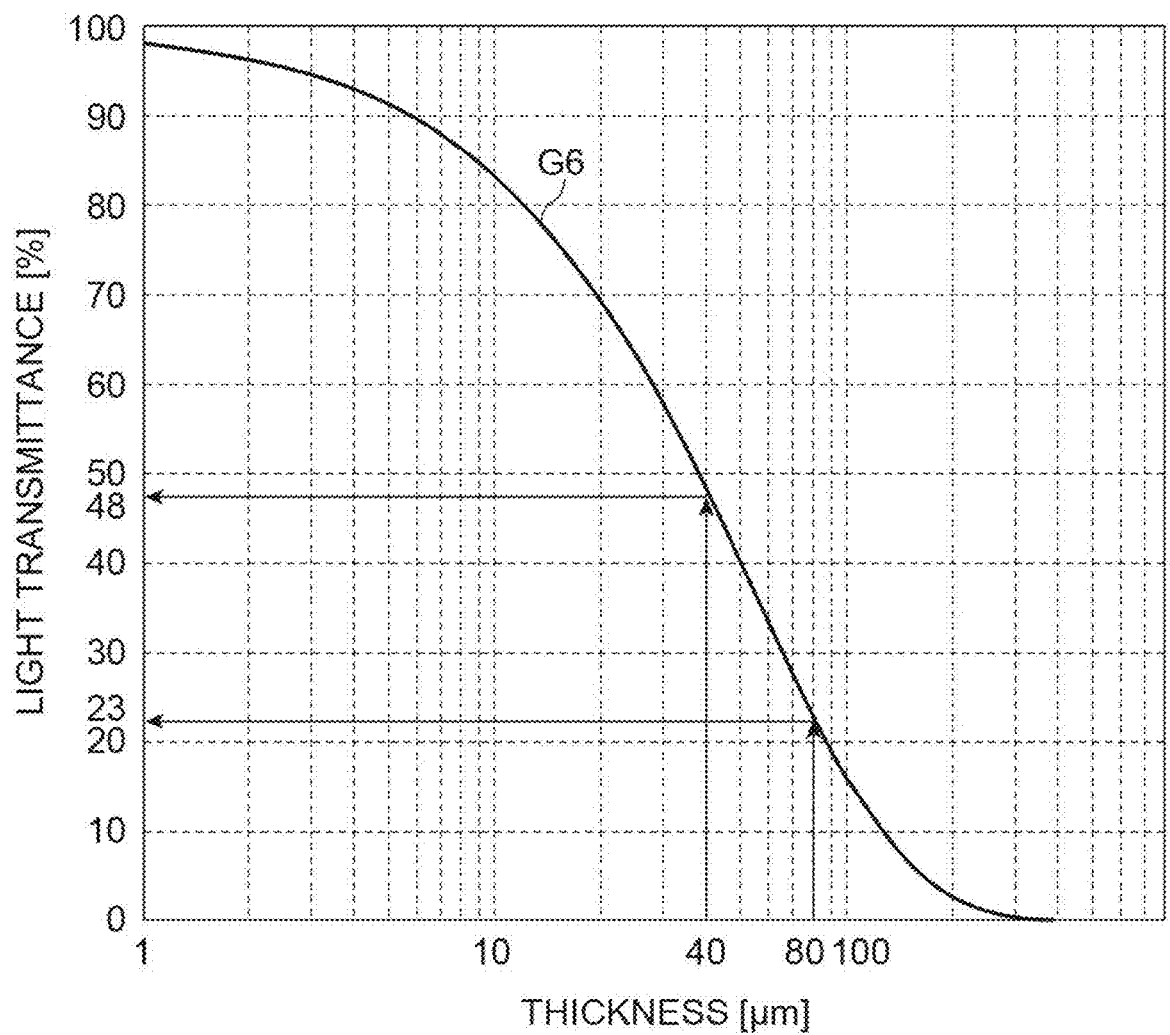
FIG. 6 is a graph showing a light transmittance of silicon.

Further, according to the combination of the irradiation light L1 having a center wavelength of 880 nm or more and 980 nm or less and the solid immersion lens 4 formed of GaAs, it is possible to obtain the reflected light L2 having a sufficient light intensity able to be used for analysis. For example, as shown in FIG. 2, the irradiation light L1 and the reflected light L2 are attenuated according to the light transmittance of silicon when they pass through the substrate 105. A graph G6 in FIG. 6 shows a relationship between the thickness of the substrate 105 formed of silicon and the light transmittance. Further, the graph G6 shows the light transmittance when the wavelength of the light is 940 nm. A horizontal axis indicates the thickness of the substrate 105. A vertical axis indicates the light transmittance. As shown in FIG. 6, as the thickness of the substrate 105 increases, the light transmittance decreases.

For example, when the thickness of the substrate 105 of the semiconductor device 100 is 80 µm which is often employed, the light transmittance is about 23%. For example, when the thickness of the substrate 105 of the semiconductor device 100 is 40 µm, the light transmittance is about 48%. According to these light transmittances, it is possible to obtain the reflected light L2 having a light intensity able to be used for various analyses. That is, it is not necessary to thin the substrate 105 by polishing or the like in order to obtain the reflected light L2 having a sufficient light intensity. As a result, when the failure analysis of the semiconductor device 100 is performed, additional work such as polishing of the substrate 105 becomes unnecessary. Therefore, the failure analysis can be easily performed. Further, if the substrate 105 is made thin, it becomes difficult to handle a semiconductor wafer. However, according to the present embodiment, even the semiconductor device 100 having a substrate thickness which is often employed can be analyzed without polishing the substrate 105. Therefore, the semiconductor wafer can be easily handled.

One embodiment of the present invention has been described above. The present invention is not limited to the above embodiment.

For example, as to the disposition of the optical system 6 and the solid immersion lens 4 with respect to the semiconductor device 100, the above embodiment illustrates a configuration in which the irradiation light L1 is provided to a side of the substrate 105 with respect to the semiconductor device 100 and the reflected light L2 output from a side of the substrate 105 is detected. For example, the irradiation light L1 may be provided to the semiconductor device from an upper side (a side of the protective layer 101 in FIG. 2). In this case, the solid immersion lens 4 is installed on the protective layer 101 of the semiconductor device 100. Alternatively, a configuration in which inspection light is applied to the semiconductor device 100 from either an upper side or a lower side thereof and an electromagnetic wave is detected from the other side thereof may be possible. In this case, the solid immersion lens 4 is installed on both the upper side and the lower side of the semiconductor device.

REFERENCE SIGNS LIST

1: Analysis device (semiconductor failure analysis device), 2: Tester (signal generation unit), 3: Light source, 4: Solid immersion lens, 5: Light detection unit, 6: Optical system, 7: Computer (analysis unit), 61: Polarization beam splitter, 62: Objective lens, 71: Data analysis unit, 71a: Heat source position identification unit, 71b: Operating frequency identification unit, 72: Control unit, 72a: Light control unit, 72b: Tester control unit, 100: Semiconductor device, L1: Irradiation light, L2: Reflected light.

The invention claimed is:

1. A semiconductor failure analysis device that analyzes for a failure portion included in a semiconductor device using a response to a stimulation signal, the semiconductor failure analysis device comprising:
    a signal generator configured to apply a stimulation signal to the semiconductor device;
    a light source configured to generate irradiation light with which the semiconductor device is irradiated;
    a solid immersion lens disposed on an optical path of the irradiation light;
    a light detector configured to receive reflected light generated by the irradiation light being reflected by the semiconductor device and to output a detection signal according to the reflected light;
    an optical system disposed between the light source and the solid immersion lens to emit the irradiation light to the semiconductor device via the solid immersion lens and disposed between the solid immersion lens and the light detection unit to emit the reflected light received via the solid immersion lens to the light detection unit; and
    an analyzer configured to obtain information on a failure portion of the semiconductor device from the detection signal,
    wherein the light source emits the irradiation light having a center wavelength of 880 nm or more and 980 nm or less, and
    wherein the solid immersion lens is formed of gallium arsenide (GaAs),
    wherein a center wavelength of the reflected light is the same as the center wavelength of the irradiation light, and
    wherein the analyzer is configured to obtain information on the failure portion of the semiconductor device using the detection signal based on a light intensity according to a light transmittance of the solid immersion lens corresponding to a temperature of the solid immersion lens.

2. The semiconductor failure analysis device according to claim 1, wherein the light source emits the irradiation light having a center wavelength of 900 nm or more and 960 nm or less.

3. The semiconductor failure analysis device according to claim 1, wherein the analyzer has a heat source position identification unit, and wherein the heat source position identification unit identifies a position of a heat source generated in the semiconductor device as a response to the stimulation signal on the basis of the detection signal and the stimulation signal.

4. The semiconductor failure analysis device according to claim 1, wherein the analyzer has an operating frequency identification unit, and wherein the operating frequency identification unit identifies a position on the semiconductor device operating at a predetermined frequency generated in the semiconductor device as a response to the stimulation signal on the basis of the detection signal and the stimulation signal.

* * * * *